United States Patent
Farjadrad et al.

(10) Patent No.: US 8,281,210 B1
(45) Date of Patent: Oct. 2, 2012

(54) OPTIMIZED CORRECTION FACTOR FOR LOW-POWER MIN-SUM LOW DENSITY PARITY CHECK DECODER (LDPC)

(75) Inventors: Ramin Farjadrad, Los Altos, CA (US); Ramin Shirani, Morgan Hill, CA (US)

(73) Assignee: Aquantia Corporation, Milpitas, CA (US)

( * ) Notice: Subject to any disclaimer, the term of this patent is extended or adjusted under 35 U.S.C. 154(b) by 1020 days.

(21) Appl. No.: 12/118,650

(22) Filed: May 9, 2008

Related U.S. Application Data

(63) Continuation of application No. 11/775,179, filed on Jul. 10, 2007, now abandoned.

(60) Provisional application No. 60/819,056, filed on Jul. 7, 2006.

(51) Int. Cl.
    *H03M 13/00* (2006.01)
(52) U.S. Cl. ...................................................... 714/755
(58) Field of Classification Search .................... 714/755
    See application file for complete search history.

(56) References Cited

U.S. PATENT DOCUMENTS

| | | | | |
|---|---|---|---|---|
| 4,295,218 A | * | 10/1981 | Tanner | 714/762 |
| 5,481,614 A | * | 1/1996 | Johnston | 381/2 |
| 5,819,212 A | * | 10/1998 | Matsumoto et al. | 704/219 |
| 6,614,858 B1 | * | 9/2003 | Pekarich et al. | 375/340 |
| 7,716,561 B2 | * | 5/2010 | Belogolovyi et al. | 714/780 |
| 2007/0011586 A1 | * | 1/2007 | Belogolovyi et al. | 714/774 |
| 2008/0086670 A1 | * | 4/2008 | Krouk et al. | 714/752 |
| 2009/0222710 A1 | * | 9/2009 | Patapoutian et al. | 714/780 |
| 2009/0222711 A1 | * | 9/2009 | Belogolovy | 714/780 |
| 2010/0174965 A1 | * | 7/2010 | Sutskover et al. | 714/752 |
| 2011/0126078 A1 | * | 5/2011 | Ueng et al. | 714/755 |
| 2011/0214039 A1 | * | 9/2011 | Steiner et al. | 714/797 |

OTHER PUBLICATIONS

Chen, J., et al., "Reduced-Complexity Decoding of LDPC Codes," (2005) IEEE Transactions on Communications, 53(8):1288-1299.

* cited by examiner

*Primary Examiner* — Amine Riad
(74) *Attorney, Agent, or Firm* — Mahamedi Paradice Kreisman LLP

(57) ABSTRACT

An iterative decoder configured to implement a min-sum with correction algorithm. The iterative decoder includes N parity check nodes coupled to M equality constraint nodes. The iterative decoder further includes a first parity check node configured to send an output to a first equality constraint node. Responsive to a minimum magnitude of other M−1 inputs to the first parity check node being lower than a pre-determined threshold, the parity check node sends the output having a same magnitude as that of the minimum magnitude of the other M−1 inputs to the first parity check node. Responsive to the minimum magnitude of the other M−1 inputs to the first parity check node being greater than the pre-determined threshold, the parity check node subtracts a correction factor in the form of $p \cdot 2^q$ from the minimum magnitude.

12 Claims, 3 Drawing Sheets

OPTIMIZED CORRECTION FACTOR FOR LOW-POWER MIN-SUM LOW DENSITY PARITY CHECK DECODER (LDPC)

CROSS-REFERENCE TO RELATED APPLICATIONS

This application is a continuation application under 35 USC §120 and claims the benefit of priority to U.S. patent application Ser. No. 11/775,179, filed Jul. 10, 2007, entitled "OPTIMIZED CORRECTION FACTOR FOR LOW-POWER MIN-SUM LOW DENSITY PARITY CHECK DECODER (LDPC)", and also claims benefit under 35 USC 119(e) of Provisional Application No. 60/819,056 filed on Jul. 7, 2006, the content of each being herein incorporated by reference.

FIELD OF THE INVENTION

The present invention relates generally to data communications, and more particularly to error correction in data communications.

BACKGROUND OF THE INVENTION

An error correcting decoder is typically implemented, e.g., in a network system, to reduce communication errors. One type of an error correcting decoder is an iterative error correcting decoder. Iterative error correcting decoders typically use a large-scale parallel network of nodes performing soft probability calculation. These nodes exchange probability information of a received data block among one another. After a certain number of iterations within an iterative decoder structure, individual noisy information in a data block (or word) is transformed into an estimate of the word as a whole. Examples of iterative decoders are the low density parity check (LDPC) decoders, Hamming decoders, Turbo decoders, and the like.

The structure of an iterative error correcting decoder can be represented graphically by a factor graph. A factor graph consists of nodes and edges, where the edges represent wire connections between the nodes, and a node represents a function of its inputs. For example, in a low density parity check (LDPC) factor graph, there are two types of nodes representing two distinct functions—i.e., "equality constraint" nodes and "parity check" nodes. According to the IEEE 802.3ae (10 GBASE-T) standard, the proposed LDPC decoder consists of (2048) equality constraint nodes and (384) parity check nodes. Each equality constraint node has (6) bidirectional connections to corresponding parity constraint nodes and each parity check node has a total of (32) bidirectional connections to corresponding equality constraint nodes. This results in a factor graph with network matrix of (12,228) connections. The probabilities associated with received bit values iterate between these two node functions to finally resolve the most probable value of each data bit.

LDPC code is specified by a parity check matrix (which is commonly referred to as an H matrix) having a very few number of "ones" per row. An example H matrix 100 is shown in FIG. 1. The length of each codeword is equal to the number of columns in the H matrix 100. In one example, each codeword is created such that the parity of each set of bits corresponding to the "ones" in a row is even. The number of rows corresponds to the number of parity checks that the codeword must satisfy. Therefore, if all errors in a received codeword are corrected by the decoder, all parity checks must be satisfied for the output codeword.

Each received data bit from a channel has a probability value (e.g., a continuous analog value or a multi-bit resolution value after an analog-to-digital conversion) associated with the data bit. The associated data value identifies the probability of the bit being "1" or "0". LDPC decoding is based on soft decoding of probabilities—i.e., probability values of bits are received in a pre-coded codeword, which codeword goes through multiple iterations of calculations based on the H matrix to arrive at enhanced probabilities. After a last iteration, a slicer determines if the original bit value was a "1" or a "0" based on a final enhanced probability associated with the bit. The two node functions in LDPC decoding—equality constraint nodes and parity check nodes—perform probability calculations as described below.

A given equality constraint node receives an initial intrinsic probability of each bit of a codeword together with a probability correction value from N parity check nodes (where N is the number of 1's in each column of the H matrix). The equality constraint node multiplies all the probabilities together and at each of the N connections, a new output probability value is determined, in which the new probability value is the product of all of the probabilities divided by the probability of that connection. In a digital domain, to replace more complex multipliers with simpler adders, the probability ratios of a bit (e.g., P1/P0) are converted to a logarithmic domain—i.e., log likelihood ratios (LLR)—and the LLR values are added.

A parity check node receives the output of M equality constraint nodes (where M is the number of 1's in each row of the H matrix), and performs a probability sum-product function. For example, if a parity check node connects to three equality constraint nodes A, B, C, then the output at connection A is given by:

$$P_{B0}P_{C1}+P_{B1}P_{C0} \qquad \text{eq. (1)}$$

and the output at connection B is given by:

$$P_{A0}P_{C1}+P_{A1}P_{C0} \qquad \text{eq. (2)}$$

and so on. Again, to avoid the use of complex multipliers, conventional techniques include use of a hyperbolic tangent that directly operates on LLR values. Another technique for performing a parity check is through use of the min-sum function. Although the min-sum function is significantly less implementation intensive compared to the sum-product function, the min-sum function generally suffers from lower decoding gain. However, a modification to the min-sum algorithm has been proposed—i.e., the "min-sum with correction" algorithm—that results in a decoder having a similar decoding gain to an implementation of the sum-product function. The "min-sum with correction" algorithm is described in an article entitled "Reduced complexity decoding of LDPC codes," by J. Cheng, et al., IEEE Transactions on Communication, vol. 53, no. 8, pp. 1288-1299, August 2005, which is incorporated by reference herein.

An important feature of one implementation of an iterative decoder is the number of iterations that the iterative decoder can perform on an input codeword in a given amount of time as it relates to the bit error rate (BER) of the iterative decoder. A higher number of iterations results in a better BER performance of an iterative decoder. Therefore, to maximize the performance of a single iterative decoder, it is generally preferred to have a given iterative decoder perform a higher number of iterations in a certain time interval—i.e., to go through a certain number of equality constraint and parity check nodes per unit time (which determines the BER performance of the iterative decoder). Another factor that affects the performance of a digital decoder is the resolution of probability messages at the inputs and between equality constraint nodes and parity check nodes. A higher resolution can potentially result in better performance of the decoder as probability calculations are performed more accurately and with a smaller error.

Accordingly, there is a trade off between the number of iterations an iterative decoder can perform in a time interval of each data codeword versus the power and complexity of the iterative decoder. In a digital iterative decoder, one can increase the clock frequency, increase the gate sizes, add more flip-flops between logic stages, adopt different implementation architectures, and/or run at higher supply voltage in order to get more iterations per codeword at cost of more power.

SUMMARY OF THE INVENTION

In general, in one aspect, this specification describes a technique to reduce the resolution of messages and, therefore, the logic complexity in a digital implementation of a "min-sum with correction" algorithm without any compromise in performance. Accordingly, in one implementation, an iterative decoder configured to implement a min-sum with correction algorithm is disclosed. The iterative decoder includes N parity check nodes coupled to M equality constraint nodes. The iterative decoder further includes a first parity check node configured to send an output to a first equality constraint node. Responsive to a minimum magnitude of other M−1 inputs to the first parity check node being lower than a pre-determined threshold, the parity check node sends the output having a same magnitude as that of the minimum magnitude of the other M−1 inputs to the first parity check node. Responsive to the minimum magnitude of the other M−1 inputs to the first parity check node being greater than the pre-determined threshold, the parity check node subtracts a correction factor in the form of $p \cdot 2^q$ from the minimum magnitude.

Implementations can include one or more of the following features. The correction factor can be identified empirically. The output can have a resolution of 8 bits, and the correction factor can be 19. The correction factor, in one example implementation of a decoder, can be in the form of one of the following: $9 \times 2^1$, $2^4$, $5 \times 2^2$, $11 \times 2^1$, or $3 \times 2^3$. The iterative decoder can be one of a low density parity check (LDPC) decoder, a Hamming decoder, or a Turbo decoder. The iterative decoder can be compliant with IEEE 10G-BaseT standards, or other IEEE standards.

The details of one or more implementations are set forth in the accompanying drawings and the description below. Other features and advantages will be apparent from the description and drawings.

BRIEF DESCRIPTION OF THE DRAWINGS

Like reference symbols in the various drawings indicate like elements.

DETAILED DESCRIPTION

Figure 1:
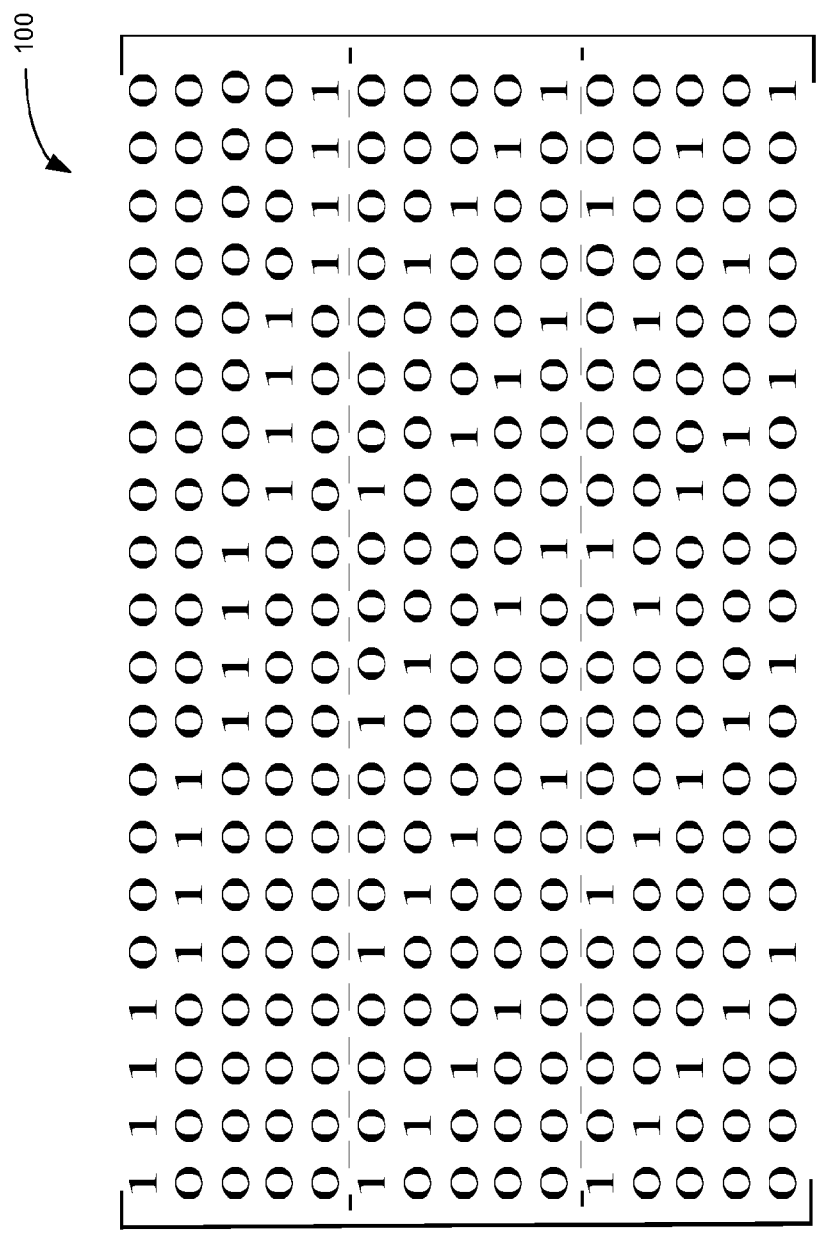
FIG. 1 is a diagram of an H matrix.

The present invention relates generally to data communications, and more particularly to error correction in data communications. The present invention is not intended to be limited to the implementations shown but is to be accorded the widest scope consistent with the principles and features described herein.

As discussed above, one way to implement a LDPC decoder is using the min-sum with correction algorithm. According to the min-sum with correction algorithm, to generate a parity output, a parity check node outputs the minimum magnitude of other M−1 inputs (instead of performing a sum of products of all other M−1 inputs). If the magnitude (of other M−1 inputs) is lower than a pre-determined threshold, the parity check node outputs the same magnitude. However, if the magnitude (of other M−1 inputs) is higher than the pre-determined threshold, a correction factor—a fixed offset value (e.g., smaller than the threshold value)—is subtracted from the magnitude value (e.g., through the parity check node or other logic) before the magnitude value is sent from the parity check node. The sign of the parity output is the product of all other M−1 inputs and not only the sign of the minimum input.

One common feature in iterative soft decoders is that the resolution of messages affects the calculation accuracy and, therefore, the decoder gain. An observation of an LDPC decoder performing a complete sum-product algorithm shows that the resolution of input messages (referred to herein as "intrinsic messages") to the LDPC decoder can be notably lower than the resolution of the messages communicated between equality constraint nodes and parity check nodes. For example, in an LDPC decoder where the required message resolution is 8 bits, the resolution of intrinsic messages can be as low as 4-5 bits. Considering that in iterative soft decoders the number of messages communicated between nodes is significantly higher than the number of input messages, the complexity of the decoder is mainly defined by resolution of internal messages—i.e., messages communicated between equality constraint nodes and parity check nodes.

The same case applies to LDPC decoders that implement the min-sum with correction algorithm. However, there is a subtle difference in that a non-linear function is not associated with the min-sum with correction algorithm and, as a result, the resolution of the internal messages is only defined by the resolution of intrinsic messages and correction factor. The correction factor associated with the min-sum algorithm brings the performance of a min-sum algorithm very close to that of the ideal sum-product algorithm. The selection of the correction factor, therefore, is very important and (in one implementation) the correction factor is found empirically. Ideally, one would like to reduce the resolution of internal messages to that of intrinsic messages, however, an empirical analysis may lead to a correction factor figure having a finer resolution, which resolution determines the resolution of the internal message.

Figure 2:
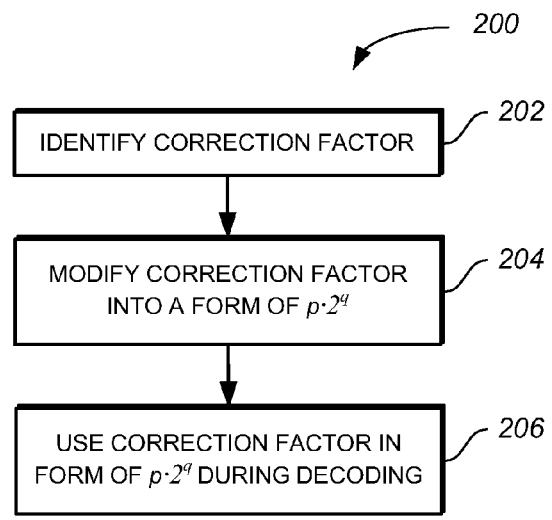
FIG. 2 illustrates one implementation of a method for selecting a correction factor for use in a decoder that implements a min-sum with correction algorithm.

FIG. 2 illustrates one implementation of a method 200 for selecting a correction factor for use in a decoder that implements a min-sum with correction algorithm. A correction factor is identified (step 202). In one implementation, a correction factor is identified for a decoder in a pre-determined signal-to-noise ratio (SNR) condition. In one implementation, the correction factor is determined empirically—e.g., from observation or experiment. A correction factor can be identified through other suitable techniques. The correction factor is modified into the form of $p \cdot 2^q$ that is closest to the ideal correction factor. In one implementation, p is an odd number and is as small as possible, and q is an integer and is as large as possible. Basically, if the best correction factor for a given SNR condition has k bits of finer resolution compared to intrinsic messages, ideally we would like the q in p·2$^q$ to be equal to k (i.e., q=k). However, the above choice may not be possible due to notable degradation in decoder performance and, therefore, a smaller q must be chosen as maximum.

As discussed above, a reduction in resolution of internal messages proportionally reduces the complexity (either size, speed, or combination of the two) of a decoder. For example, in a decoder with an original internal message resolution of 8 bits and an intrinsic message resolution of 5 bits, reducing the correction factor complexity by two bits permits the overall decoder complexity to be reduced by 25% (1−6/8=0.25).

Figure 3:
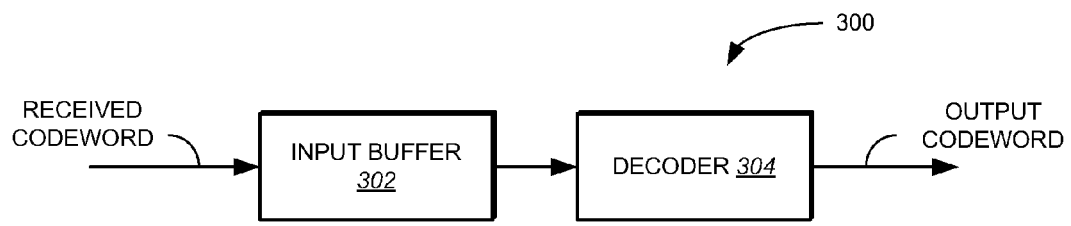
FIG. 3 is a block diagram of a decoding architecture for a decoder according to one implementation.

FIG. 3 illustrates one example of a decoding architecture 300 suitable for implementing techniques described herein. In one implementation, the decoding architecture 300 can be a decoding architecture as described in U.S. patent application Ser. No. 11/676,946, entitled "Low Power Iterative Decoder Using Input Data Pipelining and Voltage Scaling", filed on Feb. 20, 2007, the entire contents of which are incorporated by reference herein. In one implementation, the decoding architecture 300 includes an input buffer 302, and a decoder 304. The input buffer 302 is a memory that stores one or more codewords to be processed by the decoder 304. In one implementation, the input buffer is a FIFO (First-In, First-Out) buffer. In one implementation, the decoder 304 is an iterative decoder. For example, the decoder 304 can be a low density parity check (LDPC) decoder, a Hamming decoder, or a Turbo decoder. In general, the decoder 304 can be any other type of error correcting decoder that processes codewords in an iterative manner.

Figure 4:
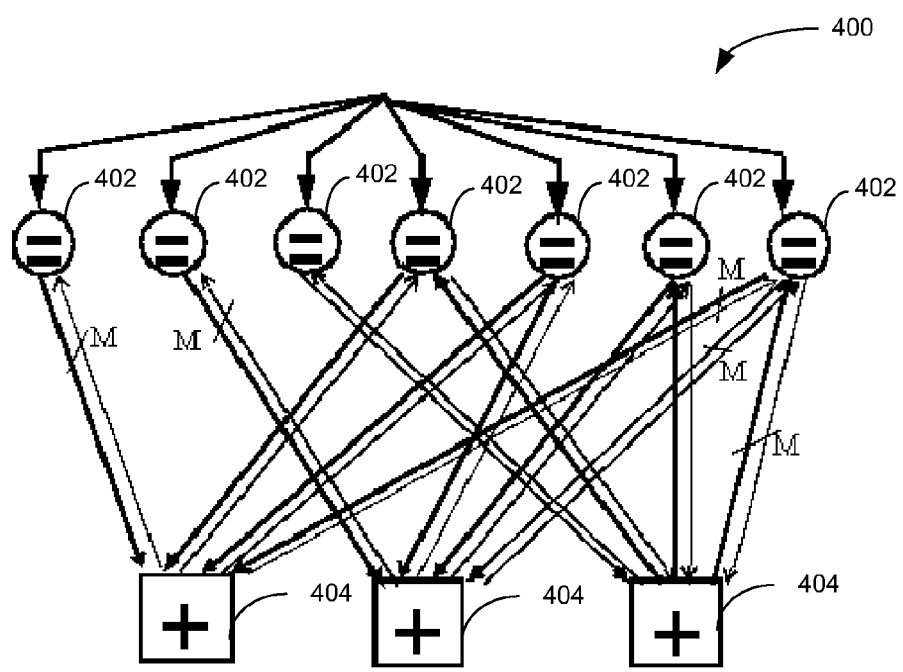
FIG. 4 is a block diagram an iterative decoder including a first set of nodes and a second set of nodes according to one implementation.

FIG. 4 illustrates a block diagram of an iterative decoder 400 having a reduced complexity in accordance with one implementation. In general, the iterative decoder 400 can be a low density parity check (LDPC) decoder, Hamming decoder, Turbo decoder, or the like. In one implementation, the iterative decoder 400 includes a first set of nodes 402 having N bits of resolution, and a second set of nodes 404 also having N bits of resolution. The first set of nodes 402 can be equality constraint nodes and the second set of nodes 404 can be parity check nodes.

In a 10G-BaseT implementation, an LDPC decoder using a min-sum with correction algorithm can have few correction factors that result in an optimum performance for the decoder. For example, one correction factor that was found empirically for 8 bit messaging is a correction factor of 19. Therefore, correction factors closest to 19 that are in the form of p·2$^q$ include—18=9×2$^1$, 16=2$^4$, 20=5×2$^2$, 22=11×2$^1$, 24=3×2$^3$. As discussed above, the higher the value of q, the smaller the decoder would be at the price of possible less decoding gain. Such a tradeoff can be directly used to implement LDPC decoders for short versus long reach channels where different SNR gains are required. In one implementation of a 10G-BaseT LDPC decoder using min-sum with correction algorithm, where the input messages have 6 bits of resolution, the original 8 bits messaging can be reduced to 6 bits, if a correction factor of 16, 20 or 24 is used. In such a case, the correction factors for new 6 bit messaging can be 4, 5 or 6. In another implementation where the input messages have 5 bits of resolution, the resolution of the internal messages can be further reduced to 5 bits for correction factors of 16 (2$^4$) and 24 (3×2$^3$), while it would be limited to 6 bits if correction factor of 20 (5×2$^2$) is chosen.

As a summary, the following is described in this disclosure: In iterative min-sum with correction soft decoders, if the actual correction factor is chosen in the form of p·2$^q$ with minimum distance to the optimal correction factor, then the logic complexity of the decoder can be reduced by q/k, where k is the original resolution of the internal messages as dictated by the optimal correction factor.

Various implementations of a decoding architecture have been described. Nevertheless, various modifications may be made to the implementations, and any variation would be within the scope of the present invention. For example, though examples described above generally described with respect to an iterative decoder, the techniques are applicable to other types of decoders. In addition, the techniques described herein can be applicable to satellite communications (e.g., DVB-S2 (Digital Video Broadcasting)), MIMO-OFDMA cellular systems, as well as read-channel for hard discs, and other systems. Accordingly, many modifications may be made without departing from the scope of the following claims.

What is claimed is:

1. An iterative decoder configured to implement a min-sum with correction algorithm, the iterative decoder having N parity check nodes coupled to M equality constraint nodes, the iterative decoder having a configurable decoder SNR gain versus decoder complexity, the decoder comprising:
a first parity check node configured to send an output to a first equality constraint node,
wherein responsive to a minimum magnitude of other M−1 inputs to the first parity check node being lower than a pre-determined threshold, the panty check node sends the output having the same minimum magnitude as that of the minimum magnitude of the other M−1 inputs to the first parity check node, whose sign is the product of the signs of all M−1 inputs,
wherein responsive to the minimum magnitude of the other M−1 inputs to the first parity check node being greater than the pre-determined threshold, the parity check node subtracts a correction factor in the form of p·2$^q$ from the minimum magnitude, whose sign is the product of the signs of all M−1 inputs, and
wherein p and q represent selectable integers such that a higher value of q corresponds to a lower decoder complexity, and the decoder SNR gain is based on the value of P such that a lower magnitude of a difference between the correction factor and an optimal correction factor increases the decoder SNR gain.

2. The iterative decoder of claim 1, wherein the correction, factor is identified empirically.

3. The iterative decoder of claim 2, wherein;
the output has a resolution of 8 bits; and
the correction factor is 19.

4. The iterative decoder of claim 3, wherein the correction factor is in the form of one of the following: 9×2$^1$, 2$^4$, 5×2$^2$, 11×2$^1$, or 3×2$^3$.

5. The iterative decoder of claim 4, wherein the iterative decoder is one of a low density parity check (LDPC) decoder, a Hamming decoder, or a Turbo decoder.

6. The iterative decoder of claim 5, wherein the iterative decoder is compliant with IEEE 10G-BaseT standards.

7. A method for selecting a correction factor for use in an iterative decoder that implements a min-sum with correction algorithm, the iterative decoder having N parity check nodes coupled to M equality constraint nodes and having a configurable decoder SNR gain versus decoder convexity, the method comprising:
sending an output from a first parity check node to a first equality constraint node,
wherein responsive to a minimum magnitude of other M−1 inputs to the first parity check node being lower than a pre-determined threshold, sending the output from the first parity check node includes sending the output having the same minimum magnitude as that of the minimum magnitude of the other M−1 inputs to the first parity check node whose sign is the product of the signs of all M−1 inputs, wherein responsive to the minimum magnitude of the other M−1 inputs to the first parity check node being greater than the pre-determined threshold, the method further includes subtracting a correction factor in the form of $p \cdot 2^q$ from the minimum magnitude whose sign being product of the signs of, all M−1 inputs prior to sending the output to the first equality constraint node, and wherein p and q represent selectable integers such that a higher value of q corresponds to a lower decoder complexity and the decoder SNR gain is based on the value of P such that a lower magnitude of a difference between the correction factor and an optimal correction factor increases the decoder SNR gain.

8. The method of claim 7, wherein the correction factor is identified empirically.

9. The method of claim 8, wherein:
the output has a resolution of bits; and
the correction factor is 19.

10. The method of claim 9, wherein the correction factor is in the form of one of the following: $9 \times 2^1$, $2^4$, $5 \times 2^2$, $11 \times 2^1$, or $3 \times 2^3$.

11. The method of claim 10, wherein the iterative decoder is one of a low density parity check (LDPC) decoder, a Hamming decoder, or a Turbo decoder.

12. The method of claim 11, wherein the iterative decoder is compliant with IEEE 10G-BaseT standards.

* * * * *